United States Patent
Kuroda et al.

(10) Patent No.: US 6,832,049 B1
(45) Date of Patent: *Dec. 14, 2004

(54) OPTICAL MODULE

(75) Inventors: Yasuhide Kuroda, Kawasaki (JP);
Masakazu Kishi, Kawasaki (JP);
Yoshinori Nakane, Kawasaki (JP);
Satoru Yamada, Kawasaki (JP);
Kenichiro Tsubone, Kawasaki (JP);
Yuji Miyaki, Kawasaki (JP); Shigeichi Izumi, Kawasaki (JP); Kazuhiro Suzuki, Yokohama (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/335,475

(22) Filed: Jun. 18, 1999

(30) Foreign Application Priority Data

Oct. 20, 1998 (JP) .......................................... 10-298867

(51) Int. Cl.[7] .............................................. H04B 10/00
(52) U.S. Cl. ...................................... 398/135; 398/138
(58) Field of Search .............................. 359/195, 152, 359/163; 385/14; 455/78; 361/783, 798, 818; 712/35; 398/135, 138

(56) References Cited

U.S. PATENT DOCUMENTS

| | | | | |
|---|---|---|---|---|
| 4,725,878 A | * | 2/1988 | Miyauchi et al. | 257/664 |
| 4,771,294 A | * | 9/1988 | Wasilousky | 343/853 |
| 5,014,114 A | * | 5/1991 | Heckaman et al. | 257/707 |
| 5,432,630 A | * | 7/1995 | Lebby et al. | 359/152 |
| 5,646,763 A | * | 7/1997 | Misaizu et al. | 398/197 |
| 5,780,875 A | * | 7/1998 | Tsuji et al. | 257/81 |
| 5,801,797 A | * | 9/1998 | Iida et al. | 349/73 |
| 5,822,195 A | * | 10/1998 | Brench et al. | 361/818 |
| 5,848,214 A | * | 12/1998 | Haas et al. | 385/120 |
| 5,912,809 A | * | 6/1999 | Steigerwald et al. | 361/780 |
| 6,126,487 A | * | 10/2000 | Rosenberger | 439/675 |
| 6,160,647 A | * | 12/2000 | Gilliland et al. | 359/110 |

* cited by examiner

*Primary Examiner*—Jason Chan
*Assistant Examiner*—David C. Payne
(74) *Attorney, Agent, or Firm*—Staas & Halsey LLP

(57) ABSTRACT

An optical module which can achieve miniaturization, high performance and cost reduction is provided. The optical module includes a photoelectric component, a high-speed signal processing part which processes a high-speed signal photoelectrically converted by the photoelectric component, and a low-speed signal processing part which processes a low-speed signal. The high-speed signal processing part and the low-speed signal processing part are overlapped with each other in a vertical direction and electrically connected to each other.

18 Claims, 13 Drawing Sheets

CONVENTIONAL OPTICAL MODULE

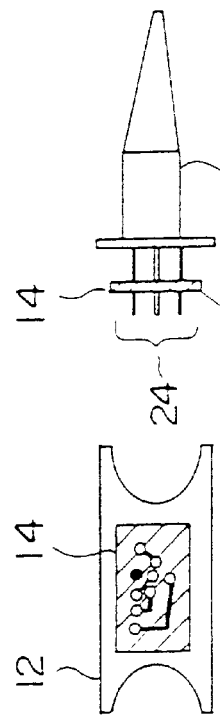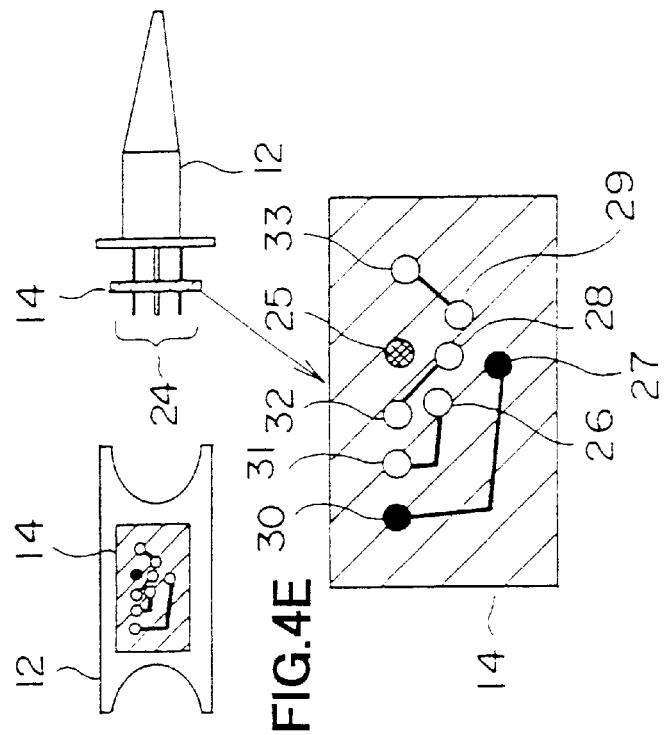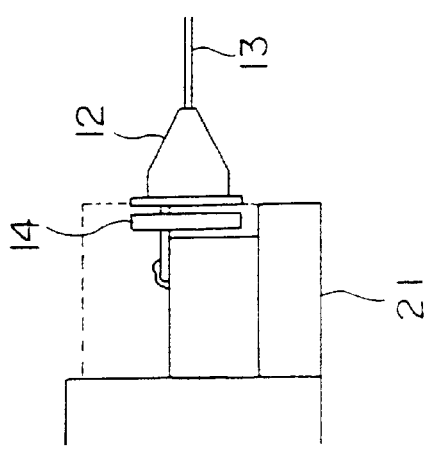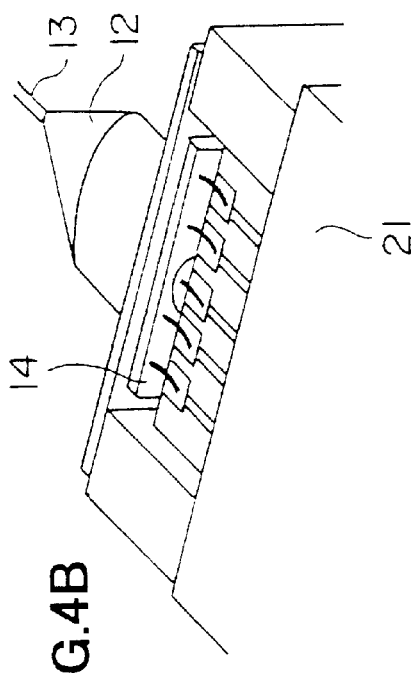

FIG.8A
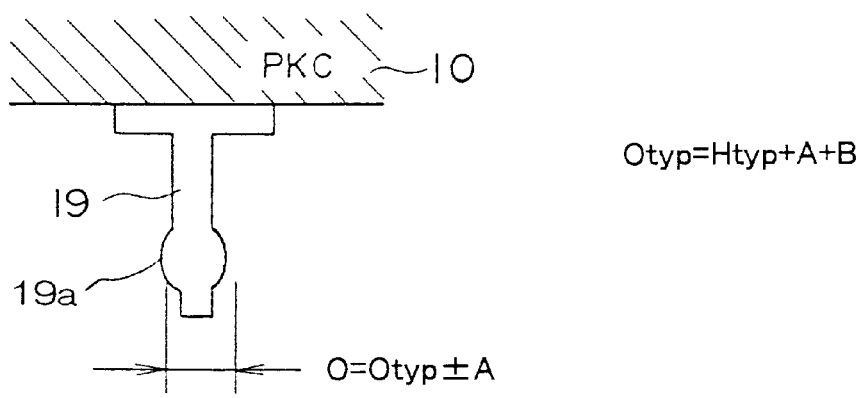
$O_{typ} = H_{typ} + A + B$
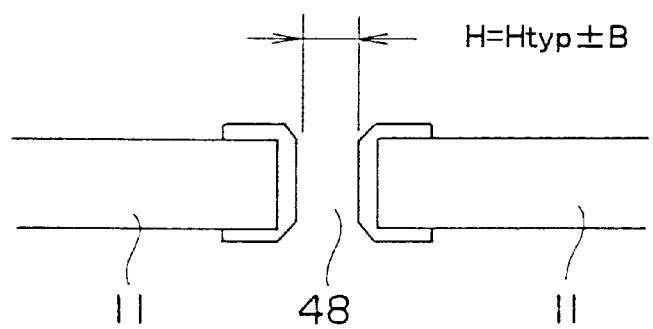
$O = O_{typ} \pm A$
$H = H_{typ} \pm B$
FIG.8B
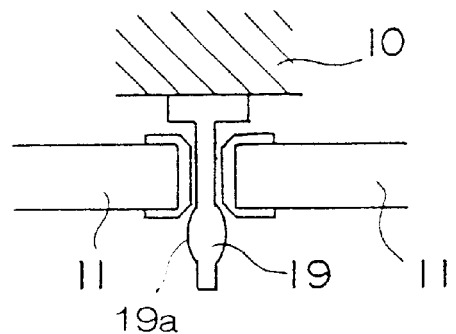

OPTICAL MODULE

BACKGROUND OF THE INVENTION

1. Field of the Invention

The present invention generally relates to an optical module, and more particularly to an optical module for performing photoelectric conversion in a high-speed optical communication system.

2. Description of the Related Art

Recently, transmission rates required in optical communication systems are being increased with an increase in the amount of data to be transmitted. Additionally, it is required to reduce sizes and costs of apparatuses provided in the optical communication systems. Particularly, in high-speed optical communication systems, it is highly required to achieve miniaturization, high performance and lower costs of optical modules used for photoelectric conversion.

Many attempts have been made to reduce sizes and costs of devices used in low-speed communication systems by integrating circuits and using bare chips and discrete components together. Additionally, attempts have been started to reduce sizes and costs of devices used in medium-speed (2.4 Gbps, for example) communication systems. The techniques to achieve the miniaturization, high performance and lower costs of the devices have been applied to the optical modules.

FIG. 1 shows an example of a conventional optical module. In FIG.1, a case 100 is made of metal and has a rectangular parallelepiped shape whose top surface is opened. A lid 110 is also made of metal and has a shape which can be engaged inside the case 100. An optical fiber cable 130 for inputting optical signals is connected to an optical component 120. The optical component 120 is fixed to the case 100 by a metal mount. Signals outputted from the optical component 120 are supplied to a printed-circuit board 140.

A high-speed circuit part 150 comprising a ceramic package is provided on the printed-circuit board 140. The printed-circuit board 140 processes low-speed signals and a part of high-speed signals. On the other hand, the high-speed circuit part 150 is dedicated to process the high-speed signals. The signals which are photoelectrically converted by the optical component 130 are so weak that the printed-circuit board 140 and the high-speed circuit part 150 are needed to be electrically shielded. Thus, the lid 110 is mounted inside the case 100 and sealed by seam welding so that the printed-circuit board 140 and the high-speed circuit part 150 are electrically shielded.

The seam welding is an electric resistance welding method used to connect metal members. Although the seam welding has an advantage that chips provided inside the package are not substantially heated, it has a drawback that the cost is high. However, characteristics of a surface acoustic wave (SAW) filter provided in the high-speed circuit part 150 are unstable and a required specification is not satisfied unless the SAW filter is used in a sealed structure. Additionally, although an IC containing a phase-locked loop (PLL) circuit may be substituted for the SAW device, such an IC has poor noise resistance and reliability as compared to the SAW filter. Thus, the seam welding is advantageously used to seal the case 100 and the lid 110, resulting in a high cost of the sealing.

Additionally, if all of the circuits are provided in a package to be sealed, a size of the package becomes large and thus the miniaturization and the cost reduction cannot be achieved.

Further, amplifiers used in an optical module which operates at a transmission rate of several Gbps are required to have a wide-range amplifying characteristic ranging from several tens of kHz to several GHz since an optical communication system generally uses a base band transmission. Thus, it is necessary to suppress impedance mismatch and generation of heat, which may be tolerated in a case of a low-speed transmission system, so that the wide-range amplifying characteristic is not degraded at a part connecting the optical component and the high-speed electric amplifier.

Still further, if a phase balance between the IC in the package to be sealed and the SAW filter is changed during the sealing process, fine adjustments of phase cannot be performed. Additionally, impedance mismatch occurs when a high-frequency transmission path passes through many layers of a multilayered board between the optical component and a main board.

SUMMARY OF THE INVENTION

Accordingly, it is an object of the present invention to provide an optical module which can achieve miniaturization, high performance and cost reduction.

The above object of the present invention is achieved by an optical module comprising:

a photoelectric component;

a high-speed signal processing part which processes a high-speed signal photoelectrically converted by the photoelectric component; and a low-speed signal processing part which processes a low-speed signal, wherein the high-speed signal processing part and the low-speed signal processing part are overlapped with each other in a vertical direction and electrically connected to each other.

In this invention, since the high-speed signal processing part and the low-speed signal processing part are separated from each other, the number of components to be sealed in the package can be decreased and thus the cost of the optical module can be reduced. Additionally, since the low-speed signal processing part and the high-speed signal processing part are overlapped with each other in a vertical direction, the optical module can be miniaturized. Further, since the low-speed signal processing part can be mounted on a multipurpose printed circuit board, double-sided surface mount can be used, and thus the miniaturization and the cost reduction can be achieved further effectively.

Additionally, the high-speed signal part may comprise a high-speed signal input part for inputting the high-speed signal, a high-speed signal processing circuit part for processing the high-speed signal inputted to the high-speed signal input part, and a high-speed signal output part for outputting the signal processed by the high-speed signal circuit part.

In this case, each of the high-speed signal output part and high-speed signal circuit part may comprise a multilayered board, the multilayered board of the high-speed signal output part having a length corresponding to a distance between the high-speed signal circuit part and a main board and being connected to the multilayered board of the high-speed signal circuit part so that the layered directions of the multilayered boards are perpendicular to each other.

In this invention, since the layered directions of the multilayered board of the high-speed signal output part and the high-speed signal circuit part are perpendicular to each other, signals from the high-speed signal circuit part always flow along the layers of the multilayered board to the main board, and thus impedance matching can be easily achieved.

Other objects and further features of the present invention will be apparent from the following detailed description when read in conjunction with the accompanying drawings.

BRIEF DESCRIPTION OF THE DRAWINGS

FIG. 4A shows a side view of a structure connecting a photoelectric component and a high-speed signal input part;

FIG. 4B shows a perspective view of the structure shown in FIG. 4A;

FIG. 4C shows a front view of the photoelectric component seen from a relay board;

FIG. 4D shows a side view of the photoelectric component;

FIG. 4E shows an enlarged view of the relay board;

FIG. 5D shows a view of the photoelectric component connected to a relay board by an adhesive;

FIG. 8A shows a structure fixing a low-speed signal processing part to the high-speed signal processing part before the low-speed signal processing part is fixed;

FIG. 8B shows the structure shown in FIG. 8A after the low-speed signal processing part is fixed;

FIG. 11C shows the structure shown in FIG. 10B after the high-speed signal output part is connected;

DESCRIPTION OF THE PREFERRED EMBODIMENTS

Figure 2:
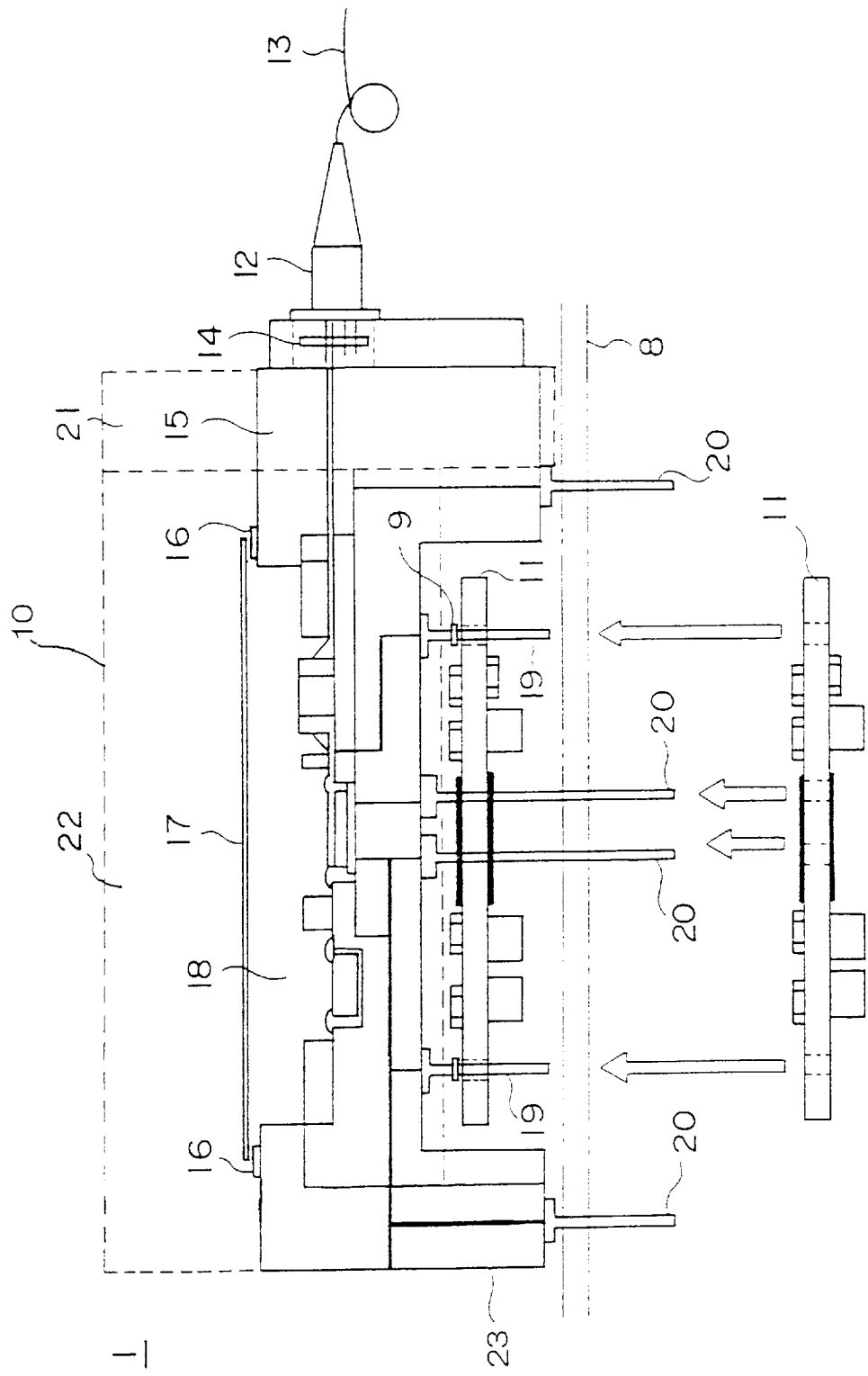
FIG. 2 shows a side view of an embodiment of an optical module according to the present invention.

FIG. 2 shows a side view of an embodiment of an optical module 1 according to the present invention. As shown in FIG. 2, an optical module 1 generally consists of a high-speed signal processing part 10 which processes high-speed signals and a low-speed signal processing part 11 which processes low-speed signals. The low-speed signal processing part 11 is disposed below the high-speed processing part 10, and mechanically and electrically connected thereto via connecting terminals 19 provided on the high-speed processing part 10. Since the high-speed signal processing part 10 and the low-speed signal processing part 11 constitute a three-dimensional structure overlapping each other in a vertical direction, an area occupied by the optical module 1 can be reduced.

The high-speed signal processing part 10 includes a high-speed signal input part 21 for inputting photoelectrically converted high-speed signals to a ceramic package, a high-speed signal circuit part 22 contained in the ceramic package for processing the high-speed signals inputted from the high-speed signal inputting part 21, and a high-speed signal output part 23 for outputting the signals processed by the high-speed signal circuit part 22.

A photoelectric component 12, which is connected to the high-speed signal input part 21 via a relay board 14, photoelectrically converts optical signals supplied from an optical fiber 13 and supplies the converted signals to the high-speed signal input part 21. A cap 15, which is made of electrically conductive plastic or rubber, is mounted to cover an opening part of the high-speed signal input part 21 so that the inside of the high-speed signal input part 21 is electrically shielded.

The high-speed signals inputted to the high-speed signal input part 21 are supplied to the high-speed signal circuit part 22. The high-speed signal circuit part 22 has a recess 18 provided on a center part thereof. A sealed space which is electrically shielded is formed by covering the recess 18 with a lid 17 and providing a seal 16. The recess 18 inside the sealed space contains a circuit which consists of SAW filters, ICs, condensers and resistors for processing the high-speed signals.

Relatively low-speed signals which need not be processed inside the sealed space are supplied to the low-speed signal processing part 11 via the connecting terminal 19. The low-speed signal processing part 11 includes, for example, a power supply control circuit, a stabilization control circuit and a phase fine-adjustment circuit. The low-speed signal processing part 11 is implemented on a low-cost general-purpose printed-circuit board in a double-sided or single-sided manner. The connecting terminal 19 has a flange 9. A position of the flange 9 is adjusted so that the low-speed signal processing part 11 is not too close to a bottom face of the high-speed signal processing part 10. Thus, it is possible to prevent the components implemented on the upper surface of the low-speed signal processing part from being in contact with the high-speed signal processing part 10.

The low-speed signal processing part 11 supplies processed signals to the high-speed signal circuit part 22 via the connecting terminal 19. Thereafter, the high-speed signal circuit part 22 supplies processed signals to the high-speed signal output part 23.

The high-speed signal output part 23 has a connecting terminal 20 for supplying the signals outputted by the high-speed signal circuit part 22 to a main board 8. Each of the high-speed signal output part 23 and the high-speed signal circuit part 22 comprises a multilayered board. The high-speed signal output part 23 is connected to the high-speed signal circuit part 22 so that the layered direction of the former is perpendicular to that of the latter. Thus, signals from the high-speed signal circuit part 22 always flow along the layers of the multilayered boards to the main board 8. In other words, a pseudo-planer electrical connection can be achieved between the high-speed signal circuit part 22 and the main board 8.

Figure 3:
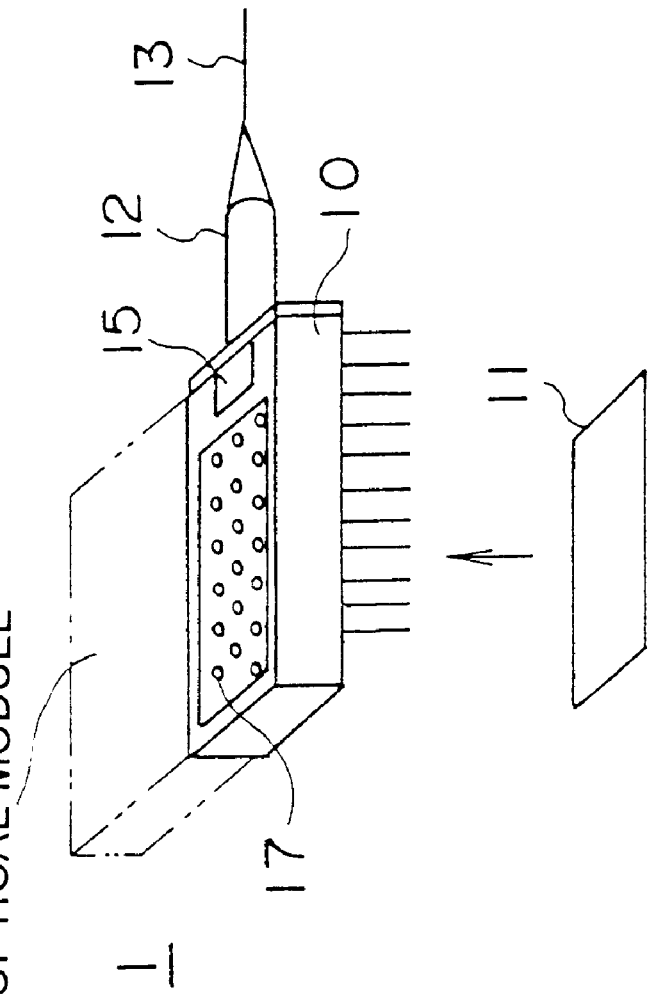
FIG. 3 shows a schematic structure of the optical module of the present embodiment.

According to the above-mentioned structure, since the high-speed signal processing part 10 and the low-speed signal processing part 11 are separately constructed, the volume of the sealed space can be decreased. Additionally, the low-speed signal processing part 11 can be implemented on an inexpensive printed-circuit board so that the cost of the optical module 1 can be reduced FIG. 3 shows a schematic structure of the optical module 1 of the present embodiment. As shown in FIG. 3, the optical module 1 consists of the high-speed signal processing part 10, the low-speed signal processing part 11 and the photoelectric component 12. As mentioned above, since the high-speed signal processing part 10 and the low-speed signal processing part 11 are separately constructed so that they are overlapped with each other in a vertical direction, the size of the optical module 1 is reduced by half as compared to a conventional optical module.

For example, a conventional optical module, which is shown by a chain line in FIG. 3, has a size of approximately 40 mm in length, 40 mm in width and 8.5 mm in height. On the other hand, the optical module 1 of the present invention has a size of 40 mm in length, 20 mm in width and 8.5 mm in height. Thus, an area required to mount the optical module 1 on the main board 8 can be halved as compared to the conventional optical module.

Now, further detailed descriptions will be given of each part of the optical module 1 in accordance with a flow of a signal in the optical module 1.

<High-speed Signal Input Part>

FIG. 4A shows a side view of a structure connecting the photoelectric component 12 and the high-speed signal input part 21, FIG. 4B shows a perspective view of the structure shown in FIG. 4A, FIG. 4C shows a front view of the photoelectric component 12 seen from the relay board 14, FIG. 4D shows a side view of the photoelectric component 12, and FIG. 4E shows an enlarged view of the relay board 14.

In the structure shown in FIGS. 4A to 4E, the photoelectric component 12 has five straight leads 24 including one lead for a signal line, three leads for power supply lines and one lead for a ground line. Generally, the leads 24 of the photoelectric component 12 are not arranged in the same plane. The relay board 14 has a function of connecting the straight leads 24 to a planar board of the high-speed signal input part 21 without bending the straight leads 24.

FIG. 4E shows through holes 25 to 33 provided on the relay board 14. The lead 24 for a signal line is positioned at a position corresponding to the through hole 25, the leads 24 for power supply lines are positioned at positions corresponding to the through holes 26, 28, 29 and the lead 24 for a ground line is positioned at a position corresponding to the through hole 27, for example.

The lead 24 for a signal line passes through the through hole 25 and is directly connected to a corresponding signal terminal of the high-speed signal input part 21. The three leads 24 for power supply lines are connected to the through holes 26, 28, 29, respectively. The through holes 26, 28, 29 are connected to the through holes 31, 32, 33, respectively, via patterns provided on the relay board 14. The through holes 31, 32, 33 are connected to corresponding signal terminals of the high-speed signal input part 21 via leads. The lead 24 for a ground line is connected to the through hole 27. The through hole 27 is connected to the through hole 30 via a pattern provided on the relay board 14. The through hole 30 is connected to a corresponding signal terminal of the high-speed signal input part 21 via a lead.

According to the above-mentioned structure, the straight leads 24 of the photoelectric component 12 can be connected to the signal terminals provided on a planar board of the high-speed signal input part 21 by providing the relay board 14. Additionally, since the lead for a signal line is directly connected to the corresponding signal terminal of the high-speed signal input part 21, a transmission loss of the weak high-speed signals can be reduced.

Figure 5A:
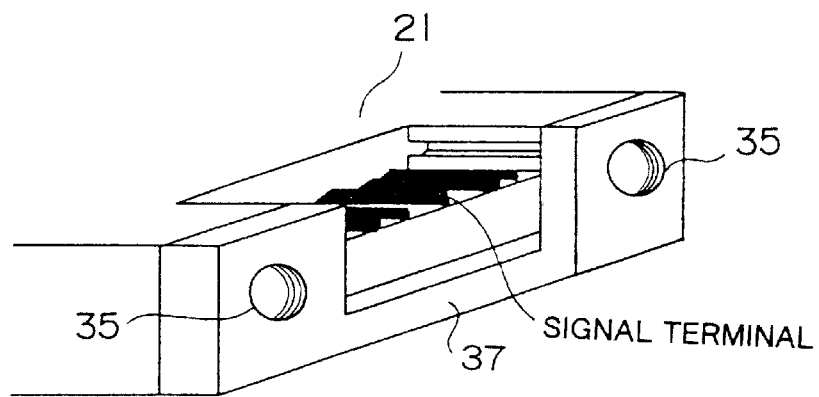
FIG. 5A shows a perspective view of the high-speed signal input part.
Figures 5B, 5C:
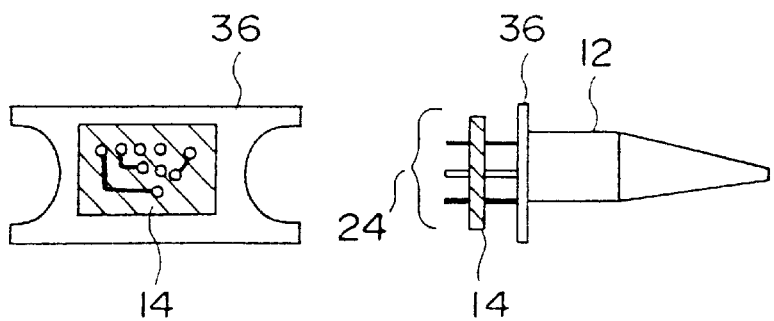
FIG. 5B shows a front view of the photoelectric component seen from the relay board.
FIG. 5C shows a side view of the photoelectric component.

FIG. 5A to 5C show an example of a structure fixing the photoelectric component 12. FIG. 5A shows a perspective view of the high-speed signal input part 21, FIG. 5B shows a front view of the photoelectric component 12 seen from the relay board 14, and FIG. 5C shows a side view of the photoelectric component 12.

As shown in FIGS. 5B and 5C, the photoelectric component 12 has a flange 36 for mechanically fixing the photoelectric component 12 to the high-speed signal input part 21 by screws. The flange 36 has notches provided on both sides thereof. Through these notches, screws are threaded into threaded holes 35 provided on a U-shaped block 37 of the high-speed signal input part 21 so that the photoelectric component 12 is fixed to the high-speed signal input part 21.

A state in which the photoelectric component 12 is fixed to the high-speed signal input part 21 is shown in the above-mentioned FIGS. 4A and 4B. In this state, the flange 36 may be bent since the flange has a thin shape. As shown in FIG. 5C, the relay board 14 is disposed apart from the flange 36. According to this structure, the relay board 14 is not affected by the bending of the flange 36 or stresses generated by the screws. The same effect can be also obtained by providing soft insulating adhesive (for example, silicone adhesive or epoxy adhesive having low elasticity) between the relay board 14 and the photoelectric component 12.

Figure 6A:
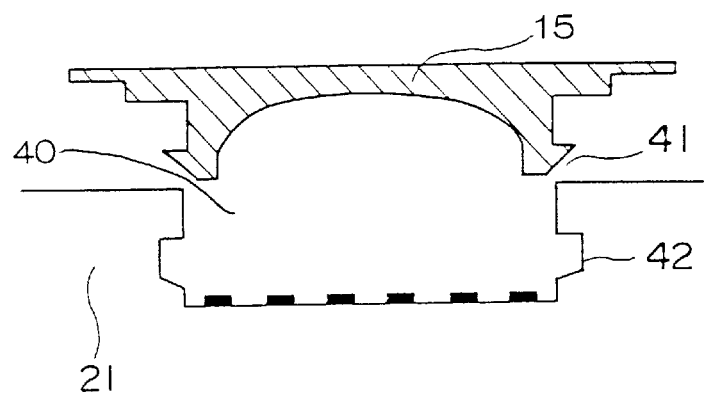
FIG. 6A shows a side view of an electrically conductive cap.
Figure 6B:
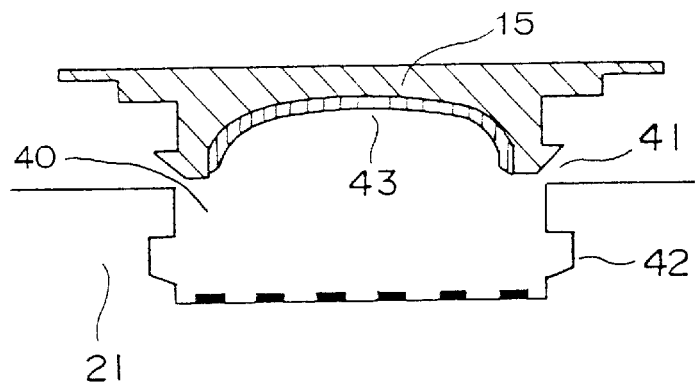
FIG. 6B shows a side view of another electrically conductive cap provided with a wave absorber.

This use of the soft insulating adhesive between the relay board 14 an the photoelectric component 12 is illustrated in FIG. 5D FIG. 6A shows aside view of the electrically conductive cap 15 which closes an opening part of the high-speed signal input part 21, and FIG. 6B shows a similar side view showing a wave absorber 43 provided on a lower face of the electrically conductive cap 15.

As shown in FIGS. 6A and 6B, the high-speed signal input part 21 has an opening part 40 for soldering the lead 24 for a signal line of the photoelectric component 12 or the leads from the relay board 14 to the corresponding signal terminals when the photoelectric component 12 is fixed. According to the structures shown in FIG. 6A, an electric shield can be achieved by closing the opening part 40 with the electrically conductive cap 15. Additionally, according to the structure shown in FIG. 6B, the performance of the electric shield can be further improved by providing the wave absorber 43 on a lower side of the electrically conductive cap 15.

The electrically conductive cap 15 has a projecting part which can be fitted into the opening part 40. An outwardly projecting claw 41 is provided on the tip of the projecting part. On the other hand, the high-speed signal input part 21 has a recess 42 provided on the side wall of the opening at a position corresponding to the claw 41. The electrically conductive cap 15 is fixed to close the opening by engaging the claw 41 with the recess 42. According to this structure, the electrically conductive cap 15 can be removed after having been fixed, and thus the photoelectric component 12 can be easily replaced.

<High-speed Signal Circuit Part>

Figure 7A:
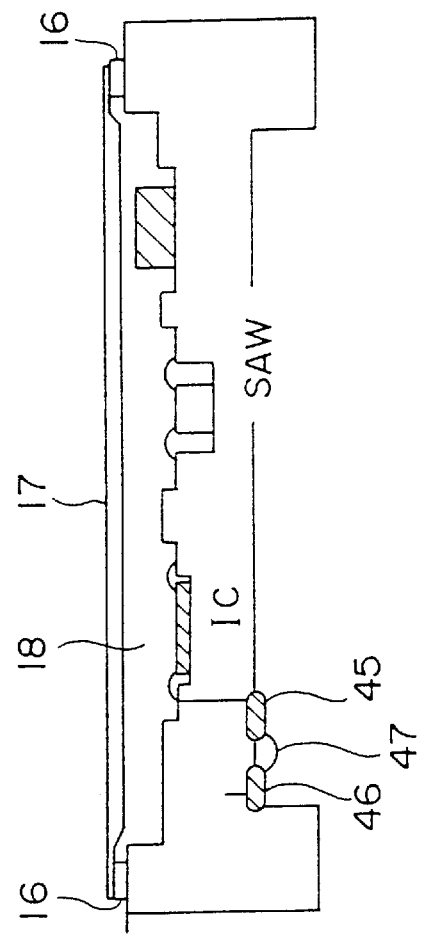
FIG. 7A shows a side view of a high-speed signal circuit part 22.
Figure 7B:
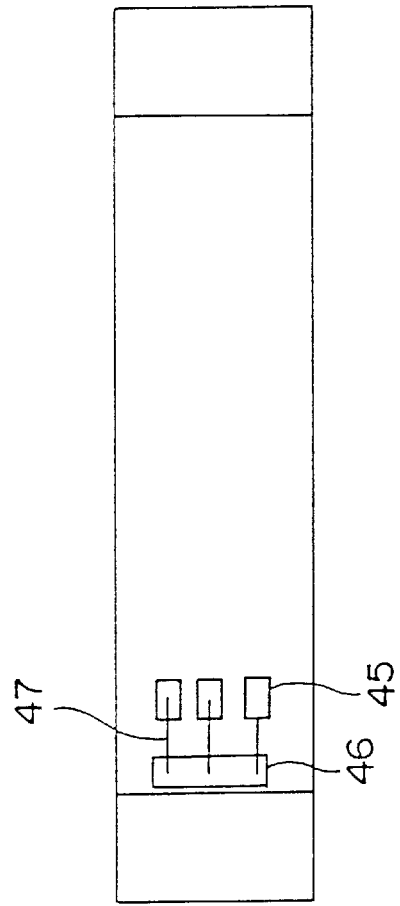
FIG. 7B shows a bottom view of the high-speed signal circuit part.

FIG. 7A shows a side view of the high-speed signal circuit part 22, and FIG. 7B shows a bottom view of the high-speed signal circuit part 22. As shown in FIG. 7A, the high-speed signal circuit part 22 has the recess 18 on a center part thereof. The recess 18 is covered with the lid 17 and the seal 16 is provided to form a sealed space which is electrically shielded. A circuit which consists of components such as SAW filters, ICs, condensers and resistors is provided on the bottom face of the recess 18 inside the sealed space. This circuit processes high-speed signals supplied from the high-speed signal input part 21.

Additionally, the high-speed signal circuit part 22 has a circuit adjustment part which consists of pattern parts 45, 46 and pattern connecting lines 47 provided outside the sealed space (for example, on a bottom face of the high-speed signal circuit 22) for adjusting the ICs provided in the sealed space. Operations of the ICs inside the sealed space can be adjusted by connecting or disconnecting the pattern part 45 and the pattern part 46 by the pattern connecting lines 47.

<Low-speed Signal Circuit Part>

FIGS. 8A and 8B show a structure fixing the low-speed signal processing part 11 to the high-speed signal processing part 10. FIG. 8A shows the structure before the low-speed signal processing part 11 is fixed, and FIG. 8B shows the structure after the low-speed signal processing part 11 is fixed.

As shown in FIGS. 8A and 8B, the connecting terminal 19 provided on the bottom face of the high-speed signal processing part 10 has a thick part 19a near the tip thereof. The maximum outside diameter O of the thick part 19a satisfies the following equation (1).

$$O = O_{typ} \pm A \tag{1}$$

Additionally, the inside diameter of a through hole 48 provided in the low-speed signal processing part 11 in which the connecting terminal 19 is inserted satisfies the following equation (2).

$$H = H_{typ} \pm B \tag{2}$$

The connecting terminal 19 and the through hole 48 are constructed so that the following equation (3) is satisfied.

$$O_{typ} = H_{typ} + A + B \tag{3}$$

In this case, the tolerances A and B are very small values, and thus the outside diameter of the thick part 19a is slightly larger than the inside diameter of the through hole 48. When the connecting terminal 19 is inserted in the through hole 48, the thick part 19 is resiliently deformed so that it can pass through the through hole 49.

According to the above-mentioned structure of the connecting terminal 19 and the through hole 48, if solder connecting the connecting terminal 19 to the through hole 48 is melted when the optical module 1 is mounted on the main board 8, the low-speed signal processing part 11 can be prevented from falling down by the thick part 19a of the connecting terminal 19 engaging with the circumferential part of the through hole 48.

<High-speed Signal Output Part>

Figure 9A:
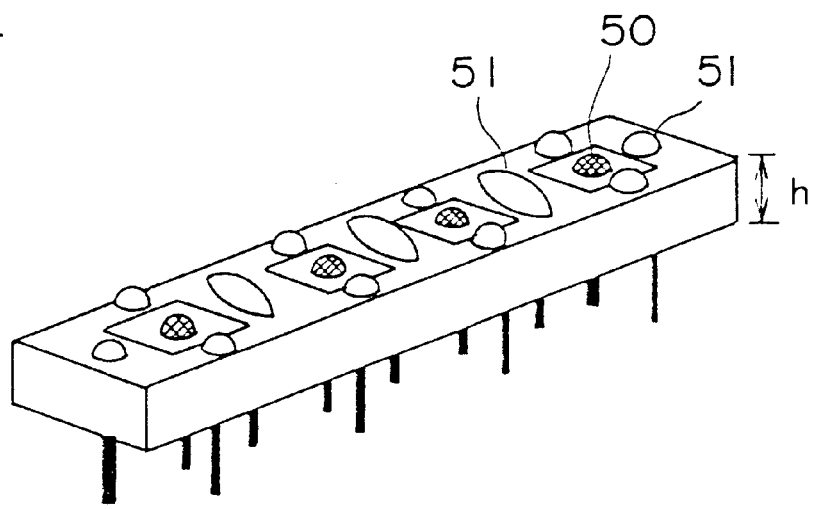
FIG. 9A shows a perspective view of a high-speed signal output part seen from an upper side.
Figure 9B:
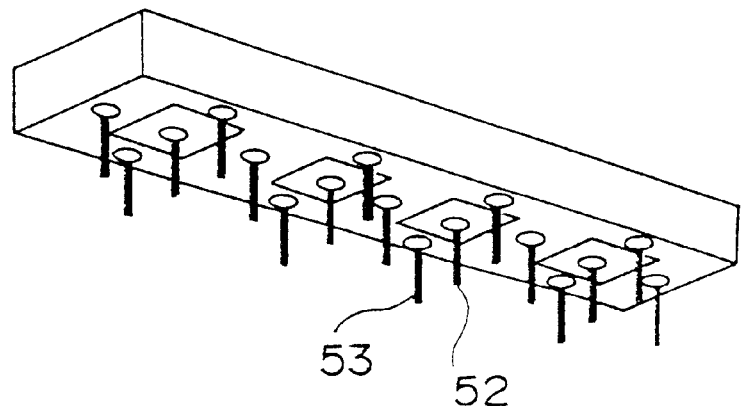
FIG. 9B shows a perspective view of the high-speed signal output part seen from a lower side.
Figure 9C:
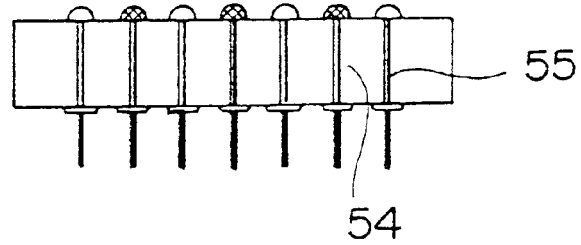
FIG. 9C shows a sectional side view of the high-speed signal output part.

FIG. 9A shows a perspective view of the high-speed signal output part 23 seen from an upper side, FIG. 9B shows a perspective view of the high-speed signal output part 23 seen from a lower side, and FIG. 9C shows a sectional side view of the high-speed signal output part 23.

As mentioned above, each of the high-speed signal output part 23 and the high-speed signal circuit part 22 comprises a multi-layered ceramic board, and the layered direction of the multilayered boards are perpendicular to each other.

As shown in FIG. 9A, the high-speed signal output part 23 is provided with signal bumps 50 for transmitting high-speed signals. Additionally, a plurality of ground bumps 51 are provided around each of the signal bumps 50. The high-speed signal output part 23 is electrically connected to the high-speed signal circuit part 22 via the bumps 50 and 51.

The signal bumps 50 and the ground bumps 51 are connected to signal patterns 54 and ground patterns 55, respectively. The patterns 54, 55 extend along the layers of the multilayered board. The signal patterns 54 are connected to the main board 8 via a connecting terminal 52 for transmitting high-speed signals, and the ground patterns 55 are connected to connecting terminals 53 for grounding provided around each of the connecting terminals 52. The high-speed signal output part 23 has a height h corresponding to a distance between the high-speed signal circuit part 22 and the main board 8.

According to the above-mentioned structure, since the high-speed signal circuit part 22 is electrically connected to the main board 8 in a pseudo-planar manner, that is, the signals from the high-speed signal circuit part 22 always flow along the layers of the circuit boards to the main board 8, an impedance matching can be easily achieved. Additionally, since the high-speed signal output part 23 connects the high-speed signal circuit part 22 to the main board 8 in a coaxial manner with the ground pattern 55 being disposed on both sides of the signal pattern 54 transmitting high-speed signals, transmission loss can be reduced.

Figure 10A:
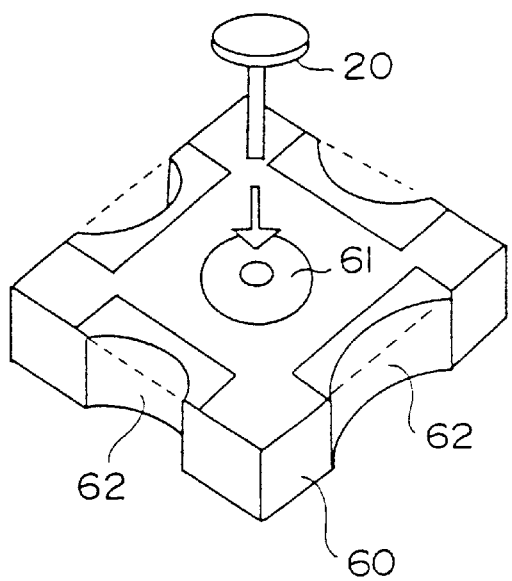
FIG. 10A shows a perspective view of a surface-mount coaxial socket.
Figure 10B:
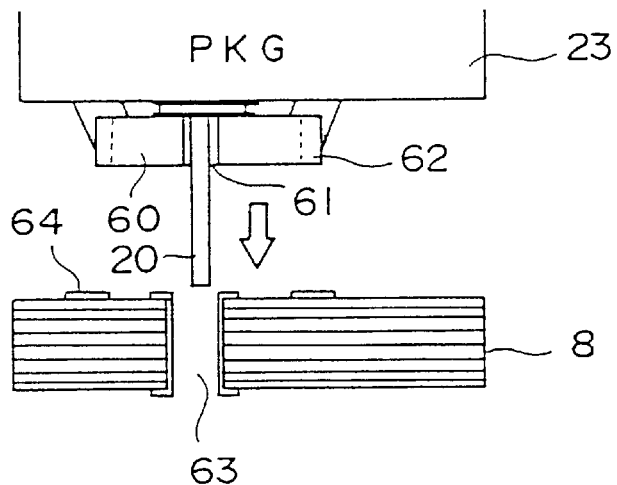
FIG. 10B shows a structure connecting the high-speed signal output part to a main board using the surface-mount coaxial socket before the high-speed signal output part is connected.
Figure 10C:
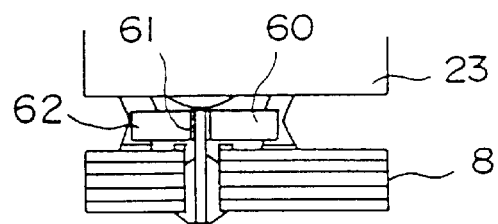

FIG. 10A shows a perspective view of a surface-mount coaxial socket 60, FIG. 10B shows a structure connecting the high-speed signal output part 23 to the main board 8 using the surface-mount coaxial socket 60 before the high-speed signal output part 23 is connected, and FIG. 10C shows the structure shown in FIG. 10B after the high-speed signal output part 23 is connected.

As shown in FIGS. 10A to 10C, the surface-mount coaxial socket 60 comprises a through hole 61 and a ground part 62 provided around the through hole 61. The connecting terminal 20 is inserted into a through hole 63 of the main board 8 through the through hole 61 of the surface-mount coaxial socket 60. On the other hand, the ground part 62 of the surface-mount coaxial socket 60 is connected to a ground part 64 of the main board 8. According to this structure, since the ground part 62 is positioned around the connecting terminal 20 for outputting high-speed signals, an effect of a coaxial connection can be obtained.

Figure 1:
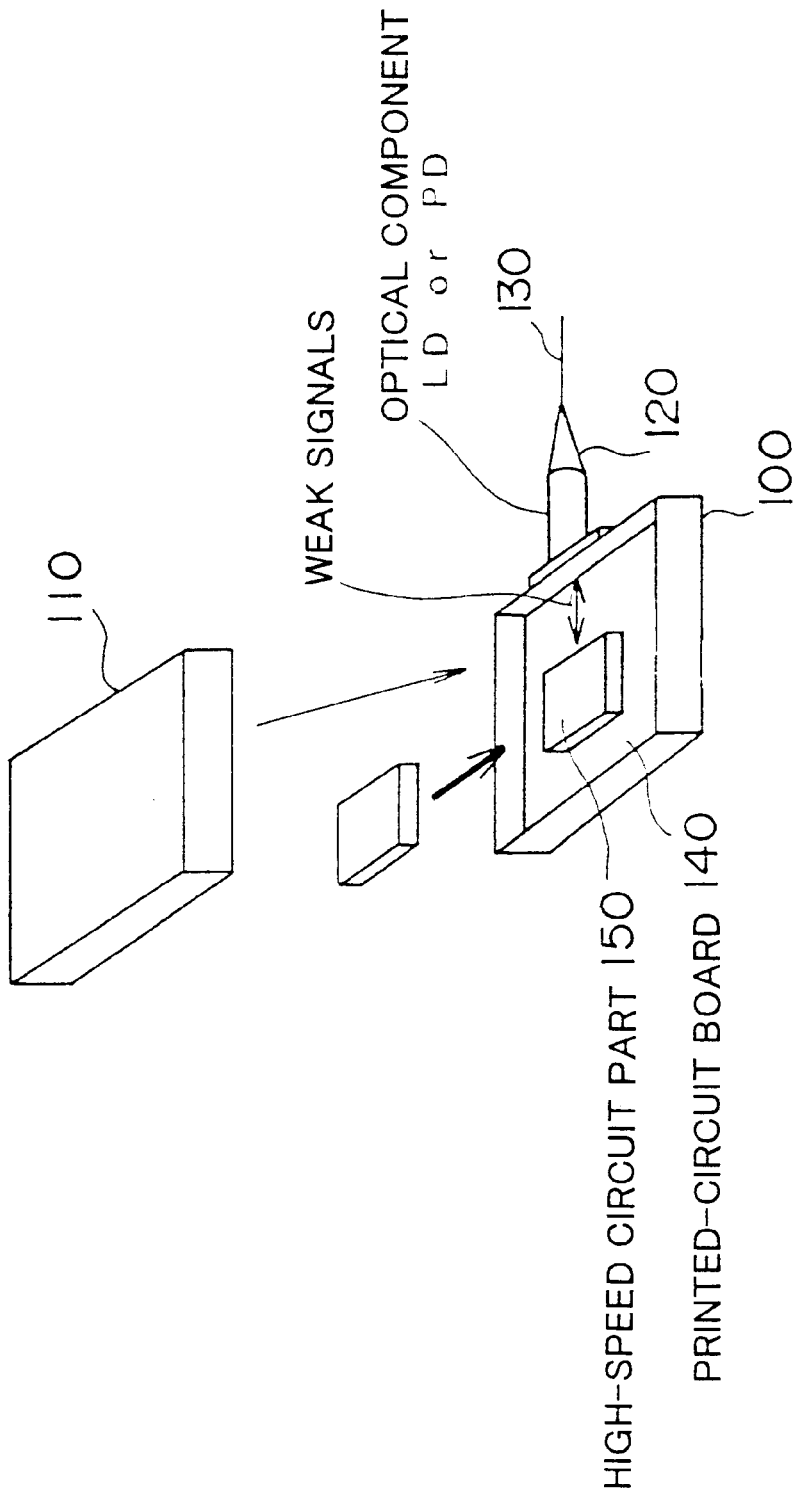
FIG. 1 shows an example of a conventional optical module.
Figure 11A:
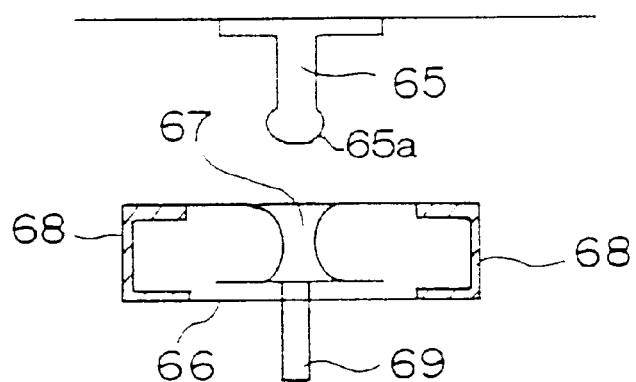
FIG. 11A shows a side view of a high-frequency coaxial socket.
Figure 11B:
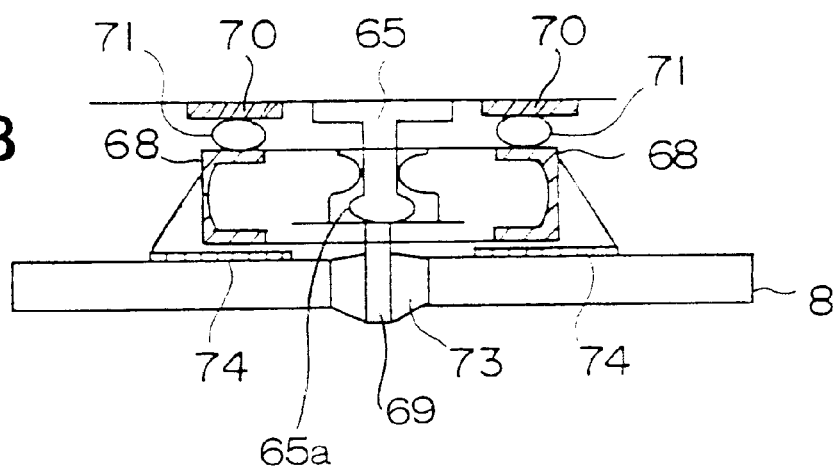
FIG. 11B shows a structure connecting the high-speed signal output part and the main board by using the high-frequency coaxial socket.

FIG. 1A shows a side view of a high-frequency coaxial socket 66 which can be used instead of the surface-mount coaxial socket 60, and FIG. 11B shows a structure connecting the high-speed signal output part 23 to the main board 8 by using the high-frequency coaxial socket 66.

As shown in FIGS. 11A and 11B, the high-frequency coaxial socket 66 comprises a receiving opening 67, a ground part 68 provided around the receiving opening 67, an electrode 69 provided at the bottom of the receiving opening 67, and a bump 71 for connecting the ground part 68 to a ground part 70 provided on the high-speed signal output part 23. The receiving opening 67 receives a connecting terminal 65 of the high-speed signal output part 23 and resiliently fixes a thick part 65a at the tip of the connecting terminal 65.

The electrode 69 of the high-frequency coaxial socket 66 is inserted into a through hole 73 and connected thereto by soldering, so that the connecting terminal 65 is electrically connected to the main board 8. Additionally, the ground part 68 of the high-frequency coaxial socket 66 is connected to a ground part 74 provided on the main board 8. According to the above-mentioned structure, since the ground part 68 is positioned around the connecting terminal 65 for outputting high-speed signals, an effect of a coaxial connection can be obtained.

Figure 12:
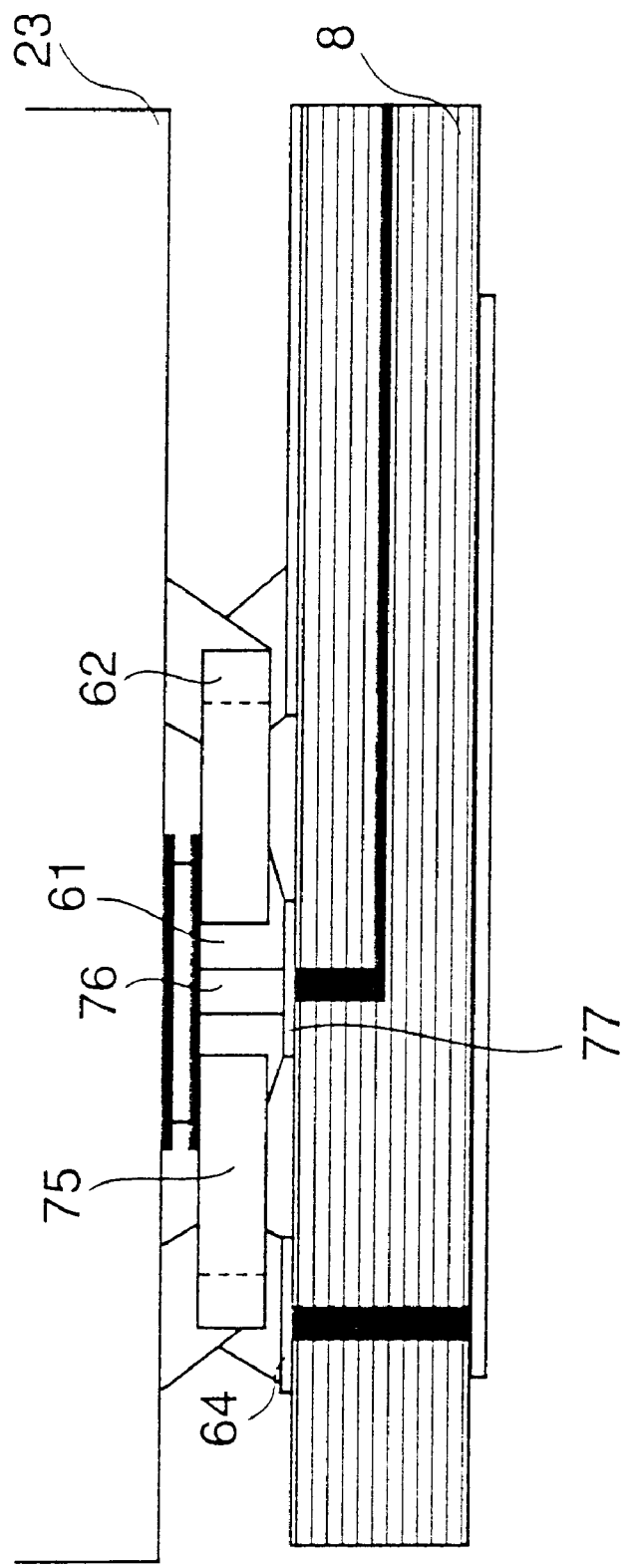
FIG. 12 shows a second embodiment of a surface-mount coaxial socket.

FIG. 12 shows a second embodiment of a surface-mount coaxial socket. In FIG. 12, those parts which are the same as the parts shown in FIGS. 10A to 10C are given the same reference numerals, and descriptions thereof will be omitted.

As shown in FIG. 12, a surface-mount coaxial socket 75 is constructed so that the tip of a connecting terminal 76 for outputting high-speed signals inserted into the through hole 61 is positioned on the same plane as the bottom surface of the coaxial socket 75. A land 77 is provided on the main board 8 at a position corresponding to the tip of the connecting terminal 76 and the connecting terminal 76 is connected to the land 77. According to the above-mentioned structure, since the ground part 62 is positioned around the connecting terminal 76 for outputting high-speed signals, an effect of a coaxial connection can be obtained. Additionally, the coaxial socket 75 can constitute a perfect surface mount structure in which the socket 75 is connected to the main board 8 only on the surface of the main board 8.

Figure 13:
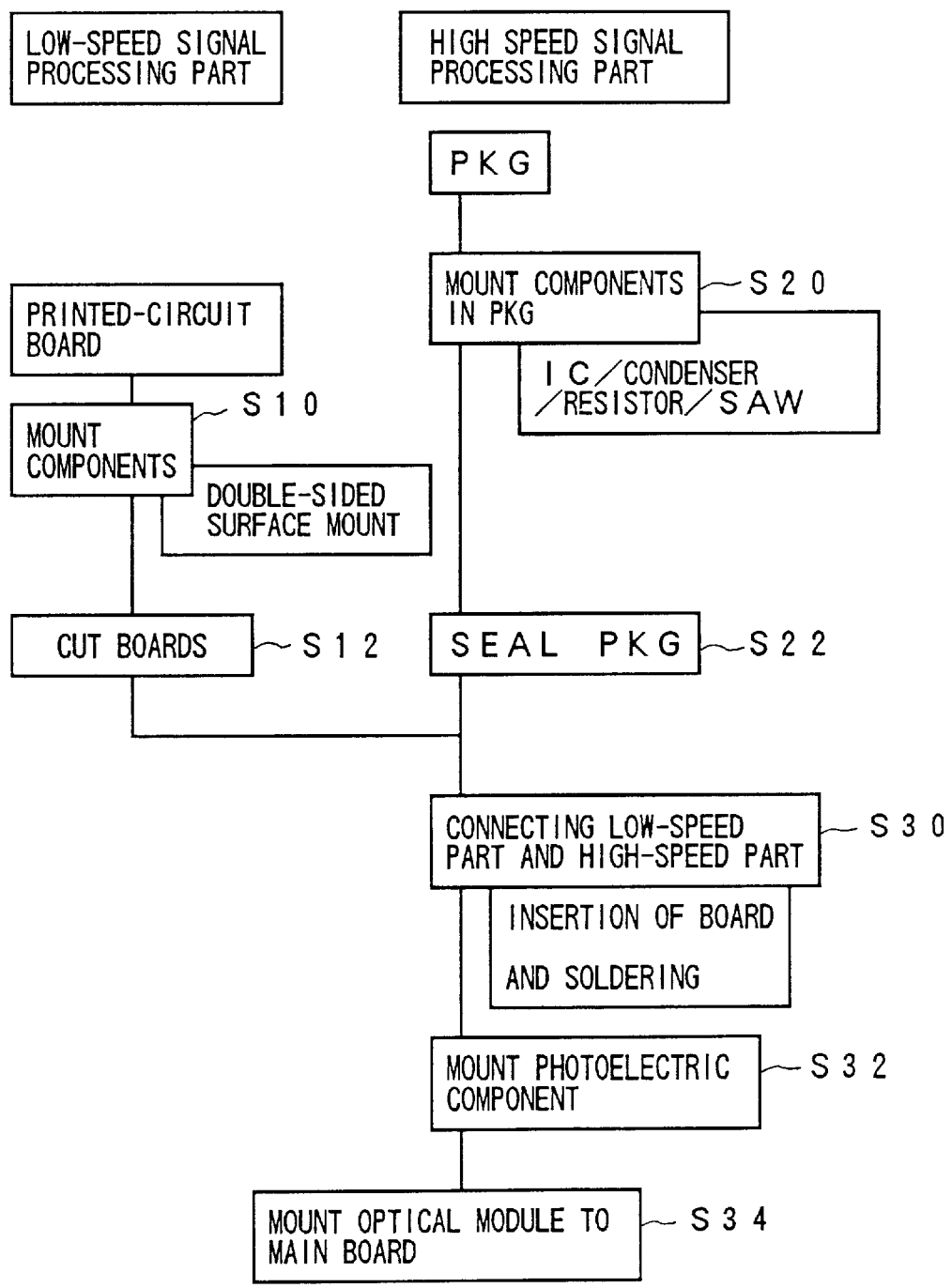
FIG. 13 shows a flow chart of an example of a process for producing the optical module.

Now, a description will be given of a process for producing the optical module 1. FIG. 13 shows a flow chart of an example of a process for producing the optical module 1. As shown in FIG. 13, the process comprises a process for producing the low-speed signal processing part 11 (S10 and S12), a process for producing the high-speed signal processing part 10 (S20 and S22), and a process for assembling the optical module 1 (S30 to S34).

In step S10, components constituting the low-speed signal processing part 11 are mounted on an inexpensive printed-circuit board. In this step S10, double-sided surface mount is used to mount the components on the printed-circuit board so that a cost for mounting the components can be reduced. Additionally, since the components are mounted before the printed-circuit board is cut off, a production time can be shortened and the cost can be further reduced. In step S12 subsequent to step S10, the printed-circuit board is cut into boards, each of which constitutes the low-speed signal processing part 11.

In step S20, components constituting the high-speed signal processing part 10 are mounted in a ceramic package. Then, in step S22, the ceramic package is sealed.

In step S30 subsequent to steps S12 and S22, the low-speed signal processing part 11 produced in steps S10, S12 and the high-speed signal processing part 10 produced in steps S20, S22 are connected via the connecting terminal 19 provided on the high-speed signal processing part 10.

In step S32 subsequent to step S30, the photoelectric component 12 is mounted to the high-speed signal processing part 10 and the electrically conductive cap 15 is mounted to cover the opening part 40 where the photoelectric component 12 is connected so that an electric shield can be achieved. In step S34, the optical module 1 produced by the process in steps S10 to S32 is mounted on the main board 8.

Since the optical module 1 produced by the above-mentioned process consists of the high-speed signal processing part 10 and the low-speed signal processing part 11 which are separately produced, the plastic package of the high-speed signal processing part 10 which requires a sealing can be miniaturized. Additionally, since an inexpensive printed-circuit board is used to constitute the low-speed signal processing part 11, double-sided surface mount can be used. Thus, according to the optical module 1 of the present embodiment, it is possible to achieve miniaturization and cost reduction of the optical module 1.

The present invention is not limited to these embodiments, but variations and modifications may be made without departing from the scope of the present invention.

The present application is based on Japanese priority application No. 10-298867 filed on Oct. 20, 1998, the entire contents of which are hereby incorporated by reference.

What is claimed is:

1. An optical module comprising:

a photoelectric component;

a high-speed signal processing part which processes a high-speed signal photoelectrically converted by said photoelectric component; and a low-speed signal processing part on a printed circuit board different from the high-speed signal processing part, with the low-speed processing part processing a low-speed signal and supplying a processed low-speed signal to the high-speed signal processing part, wherein said high-speed signal processing Part and said low-speed signal processing part are overlapped with each other in a vertical direction and electrically connected to each other, wherein said high-speed signal processing part comprises:

a high-speed signal input part for inputting said high-speed signal;

a high-speed signal circuit part for processing said high-speed signal inputted to said high-speed signal input part; and a high-speed signal output part for outputting the signal processed by said high-speed signal circuit part, with the optical module further comprising:

a relay board for converting an arrangement of leads of said photoelectric component into an arrangement of input terminals of said high-speed signal input part.

2. The optical module as claimed in claim 1, wherein said relay board is disposed apart from said photoelectric component.

3. The optical module as claimed in claim 2, wherein insulating soft adhesive is provided between said relay board and said photoelectric component.

4. The optical module as claimed in claim 2, wherein a lead of said photoelectric component for outputting a signal is positioned on a plane which includes the input terminals of said high-speed signal input part and directly connected to said input terminals without being connected to said relay board.

5. An optical module comprising:

a photoelectric component;

a high-speed signal processing part which processes a high-speed signal photoelectrically converted by said photoelectric component; and a low-speed signal processing part on a printed circuit board different from the high-speed signal processing part, with the low-speed processing part processing a low-speed signal and supplying a processed low-speed signal to the high-speed signal processing part, wherein said high-speed signal processing part and said low-speed signal processing part are overlapped with each other in a vertical direction and electrically connected to each other, wherein said high-speed signal processing part comprises:

a high-speed signal input part for inputting said high-speed signal;

a high-speed signal circuit part for processing said high-speed signal inputted to said high-speed signal input part; and a high-speed signal output part for outputting the signal processed by said high-speed signal circuit part, wherein said high-speed signal input part comprises:

an opening part in which input terminals are exposed; and an electrically conductive cap which closes said opening part.

6. The optical module as claimed in claim 5, wherein a wave absorber is provided on a bottom side of said cap.

7. The optical module as claimed in claim 5, wherein said cap is provided with an outwardly projecting claw and said high-speed signal input part is provided with a recess which can be engaged with said claw.

8. An optical module comprising:

a photoelectric component;

a high-speed signal processing part which processes a high-speed signal photoelectrically converted by said photoelectric component; and a low-speed signal processing part on a printed circuit board different from the high-speed signal processing part, with the low-speed processing part processing a low-speed signal and supplying a processed low-speed signal to the high-speed signal processing part, wherein said high-speed signal processing part and said low-speed signal processing part are overlapped with each other in a vertical direction and electrically connected to each other, wherein said high-speed signal processing part comprises:

a high-speed signal input part for inputting said high-speed signal;

a high-speed signal circuit part for processing said high-speed signal inputted to said high-speed signal input part; and a high-speed signal output part for outputting the signal processed by said high-speed signal circuit part wherein said high-speed signal circuit part is mounted in a recess provided on a package, which recess is sealed by a cap to electrically shield said high-speed signal circuit part.

9. The optical module as claimed in claim 8, wherein a circuit adjustment part for adjusting an integrated circuit in said high-speed signal circuit part is provided outside the part sealed by said cap.

10. An optical module comprising:

a photoelectric component;

a high-speed signal processing part which processes a high-speed signal photoelectrically converted by said photoelectric component; and a low-speed signal processing part which processes a low-speed signal, wherein said high-speed signal processing part and said low-speed signal processing part are overlapped with each other in a vertical direction and electrically connected to each other, wherein said high-speed signal processing part comprises:

a high-speed signal input part for inputting said high-speed signal;

a high-speed signal circuit part for processing said high-speed signal inputted to said high-speed signal input part; and a high-speed signal output part for outputting the signal processed by said high-speed signal circuit part, wherein said high-speed signal circuit part is mounted in a recess provided on a package, which recess is sealed by a cap to electrically shield said high-speed signal circuit part, and wherein a connecting terminal of said high-speed signal processing part for connecting to said low-speed signal processing part has a thick part whose maximum outside diameter O is $O_{typ} \pm A$, and the low-speed signal processing part is provided with a through hole in which said connecting terminal is inserted which through hole has an inside diameter H equal to $H_{typ} \pm B$, wherein a relationship $O_{typ} = H_{typ} + A + B$ is satisfied.

11. An optical module comprising:

a photoelectric component;

a high-speed signal processing part which processes a high-speed signal photoelectrically converted by said photoelectric component; and a low-speed signal processing part on a printed circuit board different from the high-speed signal processing part, with the low-speed processing part processing a low-speed signal and supplying a processed low-speed signal to the high-speed signal processing part, wherein said high-speed signal processing part and said low-speed signal processing part are overlapped with each other in a vertical direction and electrically connected to each other, wherein said high-speed signal processing part comprises:

a high-speed signal input part for inputting said high-speed signal;

a high-speed signal circuit part for processing said high-speed signal inputted to said high-speed signal input part; and a high-speed signal output part for outputting the signal processed by said high-speed signal circuit part wherein each of said high-speed signal output part and high-speed signal circuit part comprises a multilayered board, said multilayered board of the high-speed signal output part having a length corresponding to a distance between said high-speed signal circuit part and a main board and being connected to said multilayered board of said high-speed signal circuit part so that the layered directions of said multilayered boards are perpendicular to each other.

12. The optical module as claimed in claim 11, wherein said multilayered board of said high-speed signal output part is provided with a signal pattern for transmitting signals and a plurality of ground patterns provided on both sides of said signal pattern.

13. The optical module as claimed in claim 12, wherein said high-speed signal output part comprises: a bump for electrically connecting said high-speed signal output part to said high-speed signal circuit part; and a connecting terminal for connecting said high-speed signal output part to said main board.

14. The optical module as claimed in claim 13, wherein said bump consists of a signal bump for transmitting signals and a plurality of ground bumps provided around said signal bump.

15. An optical module comprising:

a photoelectric component;

a high-speed signal processing part which processes a high-speed signal photoelectrically converted by said photoelectric component; and a low-speed signal processing part which processes a low-speed signal, wherein said high-speed signal processing part and said low-speed signal processing part are overlapped with each other in a vertical direction and electrically connected to each other, wherein said high-speed signal processing part comprises:

a high-speed signal input part for inputting said high-speed signal;

a high-speed signal circuit part for processing said high-speed signal inputted to said high-speed signal input part; and a high-speed signal output part for outputting the signal processed by said high-speed signal circuit part, and wherein said high-speed signal output part has a high-frequency coaxial socket which connects said high-speed signal output part to a main board.

16. The optical module as claimed in claim 15, wherein said high-speed signal output part is provided with a connecting terminal having a thick part for outputting signals, wherein said high-frequency coaxial socket comprises:

a receiving opening which receives and resiliently fixes said thick part; a bump which is resiliently engaged with a ground part provided around said connecting terminal of said high-speed signal output part; a signal electrode provided at the bottom of said receiving opening; and a ground electrode provided around said signal electrode, said signal electrode and said ground electrode being connected to said main board.

17. An optical module comprising:

a photoelectric component;

a high-speed signal processing part which processes a high-speed signal photoelectrically converted by said photoelectric component; and a low-speed signal processing part which processes a low-speed signal, wherein said high-speed signal processing part and said low-speed signal processing part are overlapped with each other in a vertical direction and electrically connected to each other, wherein said high-speed signal processing part comprises:

a high-speed signal input part for inputting said high-speed signal;

a high-speed signal circuit part for processing said high-speed signal inputted to said high-speed signal input part; and a high-speed signal output part for outputting the signal processed by said high-speed signal circuit part, and wherein said high-speed signal output part has a surface-mount coaxial socket which comprises:

a through hole which connects a connecting terminal provided on said high-speed signal output part to a main board; and a ground part provided around said through hole and connected to a ground part of said main board.

18. The optical module as claimed in claim 17, wherein a tip part of said connecting is positioned on the same plane as a bottom surface of said surface-mount coaxial socket and connected to a corresponding land provided on said main board.

* * * * *

UNITED STATES PATENT AND TRADEMARK OFFICE
CERTIFICATE OF CORRECTION

PATENT NO. : 6,832,049 B1
DATED : December 14, 2004
INVENTOR(S) : Yasuhide Kuroda et al.

It is certified that error appears in the above-identified patent and that said Letters Patent is hereby corrected as shown below:

Column 10,
Line 27, change "Part" to -- part --.

Signed and Sealed this

Twenty-eighth Day of June, 2005

JON W. DUDAS
*Director of the United States Patent and Trademark Office*